United States Patent [19]

Zoellick et al.

[11] Patent Number: 5,090,918

[45] Date of Patent: Feb. 25, 1992

[54] ISOTHERMAL TERMINATION BLOCK HAVING A MULTI-LAYER THERMAL CONDUCTOR

[75] Inventors: Raymond D. Zoellick, Bothell; Peter F. Barbee, Woodinville, both of Wash.

[73] Assignee: John Fluke Mfg. Co., Inc., Everett, Wash.

[21] Appl. No.: 530,996

[22] Filed: May 31, 1990

[51] Int. Cl.⁵ .............................................. H05K 7/20
[52] U.S. Cl. .................................... 439/487; 361/387
[58] Field of Search ............... 439/55, 85, 485, 487; 361/386, 387; 174/252; 357/81

[56] References Cited

U.S. PATENT DOCUMENTS

| | | | |
|---|---|---|---|
| 3,061,760 | 10/1962 | Ezzo | 361/387 |
| 3,165,672 | 1/1965 | Gellert | 361/387 |
| 3,531,579 | 9/1970 | Katz | 174/252 |
| 4,475,145 | 10/1984 | Heil et al. | 361/386 |
| 4,495,378 | 1/1985 | Dotzer et al. | 361/386 |
| 4,725,920 | 2/1988 | Ijichi et al. | 361/386 |
| 4,946,408 | 8/1990 | Garrett et al. | 439/866 |
| 4,963,697 | 10/1990 | Peterson et al. | 361/414 |

*Primary Examiner*—Neil Abrams
*Attorney, Agent, or Firm*—Richard A. Koske

[57] ABSTRACT

An isothermal block has a multi-layer thermal conductor interleaves with different layers of a printed circuit board to provide improved thermal coupling of input terminals and a local temperature sensor mounted on the isothermal block. Each of the layers of the thermal conductor is substantially thinner than substrate layers of the printed circuit board. The layers of the thermal conductor are spaced apart from the terminals so as to be electrically isolated from the terminals. Embedded layers of the thermal conductor are spaced closer to the terminals than are external layers of the thermal conductor.

10 Claims, 3 Drawing Sheets

ISOTHERMAL TERMINATION BLOCK HAVING A MULTI-LAYER THERMAL CONDUCTOR

FIELD OF THE INVENTION

This invention relates generally to devices for terminating wires and, particularly, to isothermal termination blocks for terminating thermocouple wires.

BACKGROUND OF THE INVENTION

Thermocouples have been used for many years to make accurate temperature measurements. When in use, a thermocouple generates a temperature-related, thermoelectric voltage that can be applied to an instrument or other device to produce useful information. The information may, for example, be a display of the temperature or control signals that can be used to control other equipment. The thermocouple may be connected to an instrument directly, or by thermocouple extension wires. The thermo-electric voltage formed between the junction and the open end of the thermocouple is applied to the terminals of the instrument. The temperature-related voltage at the instrument terminals is combined with the temperature of the terminals to determine the temperature at the thermocouple junction.

The temperature of the instrument terminals may be sensed by a temperature sensor that is typically, but not necessarily, located near the terminals. To ensure accurate temperature readings by the instrument, it is important to minimize any temperature differences between the instrument terminals as well as between the terminals and the temperature sensor. That is, since the thermoelectric voltage is (at least in part) dependant on the temperature of the instrument terminals, a temperature difference between the terminals, or between the terminals and the terminal temperature sensor, may cause the instrument to make erroneous temperature readings. In order to alleviate this problem, thermocouple wires are usually connected to the instrument via an isothermal termination block that maintains the terminations at the instrument and a companion terminal temperature sensor at substantially the same temperature, i.e., isothermal.

Prior art isothermal termination blocks typically consist of a printed circuit board with input terminals, a terminal temperature sensor and a thermal conductor. The thermal conductor is usually made of a block of copper or aluminum or other material having good thermal conductivity. Typically, the thermal conductor is screwed or bolted to an exterior surface of the circuit board. In some cases the thermal conductor may be soldered to the exterior surface of the circuit board or affixed by a thermally conductive adhesive. In any event, the thermal conductor is positioned on the circuit board near the input terminals and the temperature sensor so that it thermally couples the terminals and the sensor, thereby maintaining them at the same, or substantially the same, temperature, which as noted above, is important for ensuring accurate temperature measurements.

Typically, thermal conductors are electrically conductive in addition to being thermally conductive and, therefore, must be isolated from electrical signal carrying portions of the circuit board, such as the input terminals and the local temperature sensor. Because temperatures often must be measured in the presence of AC and DC line voltages, electrifying the thermal conductor could cause damage to other equipment as well as threaten the safety of operating personnel. The thermal conductor is isolated from the terminals on the circuit board by maintaining minimum creepage and clearance distances therebetween so as to prevent voltages at the terminals from creating a conductive path or arcing to the thermal conductor. These creepage and clearance distances are established by accepted industry standards, such as ANSI/ISA-S82.01-1988, IEC 1010, and CSA C22.2, No. 231.

The clearances established by these standards take into account such variables as rated line voltages on the terminals and the type of insulator between the terminals, sensor and the thermal conductor. In the case of the prior art isothermal blocks described above (i.e., where the thermal block is mounted on the external surface of the circuit board) air and the circuit board surface form the insulators. With air as an insulator, the safety standards require a relatively large distance, or clearance and with circuit board surfaces as an insulator, the safety standards require a relatively large creepage distance between the terminals, sensor and the thermal conductor. Unfortunately, the clearance and creepage safety spacings reduce the thermal coupling between the input terminals, temperature sensor and thermal conductor, especially when air is the insulator because the required minimum spacing is so great. Thus, one way to improve the thermal coupling is to place the thermal conductor close to the terminals and the sensor. Unfortunately, safety standards limit how closely they can be spaced apart and therefore limit, to a significant degree, the thermal coupling.

Another way to improve the thermal coupling between the input terminals and the sensor is to increase the size of the thermal conductor (while still maintaining adequate safety spacings). Prior art attempts to accomplish this include increasing the thickness of the thermal conductor. In fact, in many instances the prior art thermal conductor is substantially thicker than the printed circuit board to which it is attached. Unfortunately, increasing the thickness of the thermal conductor creates an isothermal block that is both massive and expensive to manufacture.

Accordingly, there is a need for an isothermal block having a small, light weight, thermal conductor that is inexpensive to manufacture and provides improved thermal coupling. The present inventing is directed to an isothermal block having a multi-layer thermal conductor embedded in a printed circuit board designed to achieve these results.

SUMMARY OF THE INVENTION

In accordance with the present invention an isothermal block with an embedded thermally conductive layer is provided. The isothermal block includes a printed circuit board with mounting holes for input terminals, a temperature sensor locally mounted on the printed circuit board for sensing the temperature of the input terminals, and a multi-layer thermal conductor. One or more first thermally conductive layers of the multilayer thermal conductor are embedded in the printed circuit board and are spaced a first distance from, and provide thermal coupling between the terminal mounting holes and the local temperature sensor.

In accordance with further aspects of the present invention, the multi-layer isothermal block includes one or more second thermally conductive layers mounted to outer surfaces of the multi-layer printed circuit board.

The second thermally conductive layer(s) are spaced a second distance from the terminal mounting holes and the local temperature sensor and act cooperatively with the first thermally conductive layer(s) to provide thermal coupling between the terminal mounting holes and the temperature sensor. The first distance between the terminal mounting holes and the temperature sensor and the first thermally conductive layer(s) is substantially less than the second distance.

In accordance with still further aspects of the present invention, each of the first and second thermally conductive layers are made of a thin layer of copper, such that the multi-layer thermal conductor may be substantially thinner than the substrate portion of the printed circuit board.

As will be readily appreciated from the foregoing summary, the present invention provides an isothermal termination block with a multi-layer thermal conductor that provides improved thermal coupling between input terminals and a local temperature sensor mounted on the isothermal termination block.

BRIEF DESCRIPTION OF THE DRAWINGS

The foregoing and other advantages of this invention will become more readily apparent as the same becomes better understood by reference to the following detailed description taken in conjunction with the accompanying drawings, wherein.

DETAILED DESCRIPTION OF THE PREFERRED EMBODIMENT

Figure 1:
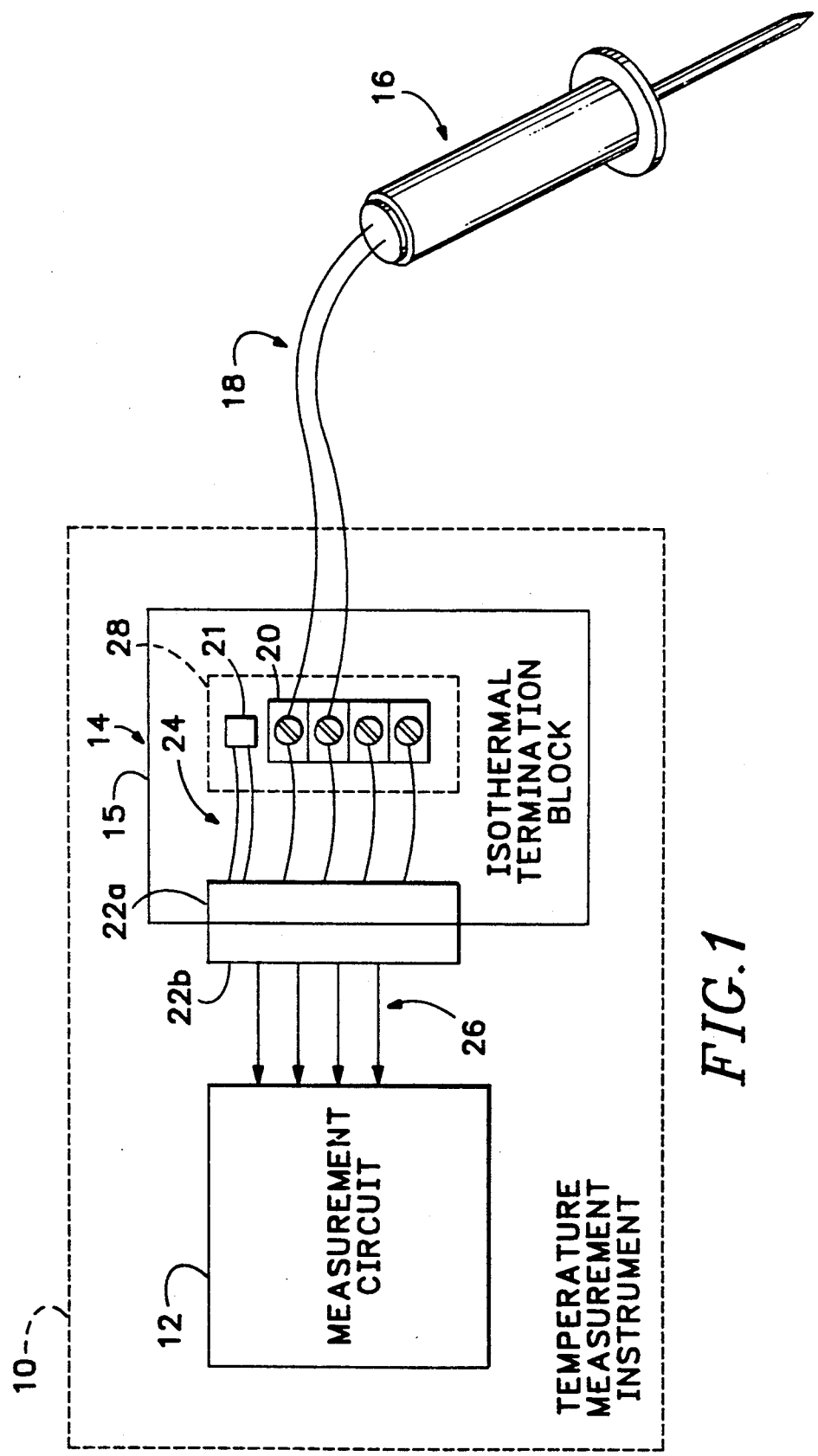
FIG. 1 is a simplified block diagram of a temperature measurement system employing a thermocouple.

FIG. 1 illustrates in simple block diagram form, an isothermal block in a temperature measurement system. A temperature measuring instrument 10 is connected to one or more temperature probes, representatively illustrated as a single probe 16. Preferably, probe 16 is a conventional thermocouple-type temperature probe that utilizes any type of thermocouple. Furthermore, while the probe 16 is depicted schematically as an immersion-type probe, it is to be understood that any other kind of probe, such as a bead or surface type thermocouple probe may be used. The instrument 10 includes a measurement circuit 12 and an isothermal termination block 14. The isothermal block 14 consists of a printed circuit board 15 with input terminals 20 for connecting to a thermocouple and a local temperature sensor 21 mounted on the circuit board 15. The temperature sensor 21 can be any type of temperature sensitive element, such as, for example, a thermistor or a transistor whose base-emitter voltage is proportional to the transistor temperature. The terminals 20 and sensor 21 are connected to a connector 22a by electrically conductive traces 24. For purposes of illustration, the terminals 20 are represented as screw-type terminals, but it is to be understood that any type of wire terminal or connector may be equally suitable. The probe 16 is connected to the input terminals 20 via thermocouple wires 18. The measuring circuit 12 is connected to the connector 22a via conductors 26 and a connector 22b that mates with connector 22a.

The measuring circuit 12 receives a temperature-related, thermo-electric voltage generated by the probe 16 via the isothermal block 14. The measurement circuit 12 also receives a signal generated by the temperature sensor 21 indicative of the temperature of the isothermal block 14. The measurement circuit 12 operates on the temperature-related voltage generated by the probe 16 and the temperature information provided by the sensor 21, and produces a desired result, such as, for example, a display of the temperature sensed by the thermocouple of probe 16.

The isothermal block 14, which is of particular interest in this application, maintains the terminals 20 and sensor 21 at the same temperature. In other words, the input terminals 20 and the temperature sensor 21 remain isothermal. As is well known in the temperature measurement field, the terminals 20 and the sensor 21 must remain very close to the same temperature if accurate measurements are to be made by the instrument 10. A temperature difference between two input terminals 20 for a particular thermocouple or between input terminals 20 and the temperature sensor 21 may cause the instrument 10 to make an erroneous temperature reading.

The isothermal characteristic of the isothermal block 14 is provided by a thermal conductor 28 attached to the block 14. The thermal conductor 28 provides thermal coupling between the terminals 20 and the temperature sensor 21. In FIG. 1 the thermal conductor 28 is represented schematically by a dashed line for clarity and may either be attached to an outer surface of the circuit board 15 or embedded therein. In any event, the thermal conductor 28 is not in electrical contact with the terminals 20, the temperature sensor 21 or the traces 24.

Figure 2:
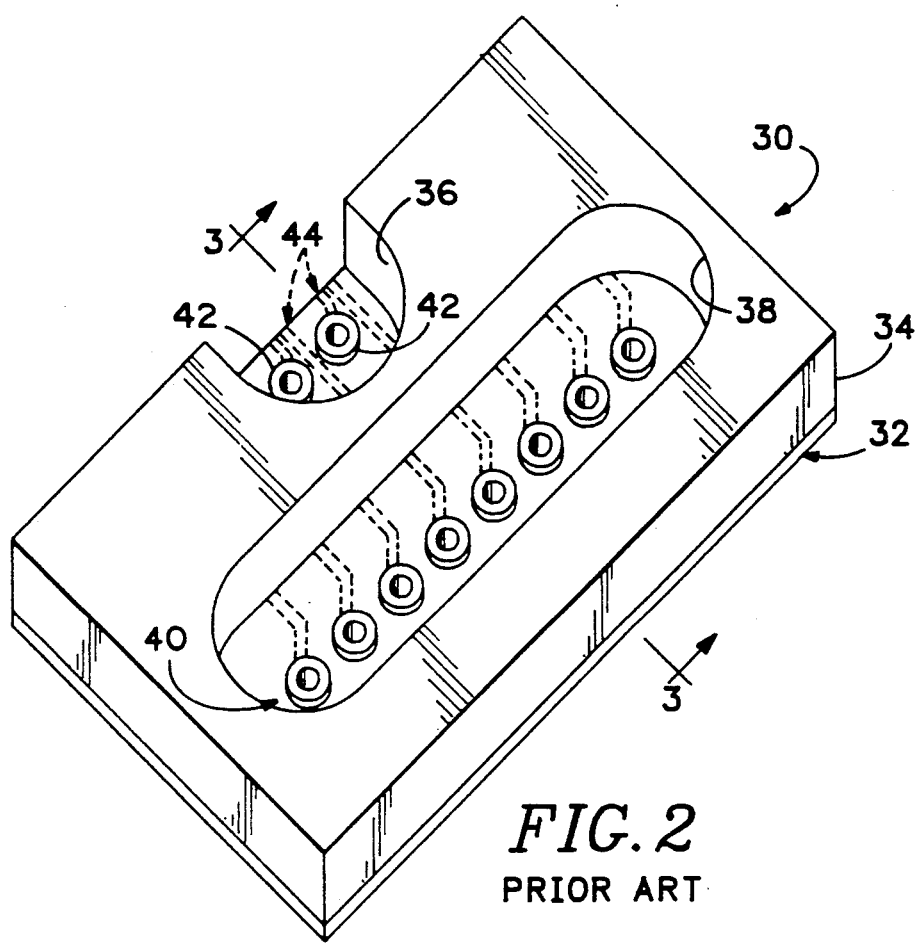
FIG. 2 is an isometric view of a prior art isothermal termination block suitable for use in the system of FIG. 1.

Turning next to FIG. 2, there is depicted a simplified isometric view of a typical prior art isothermal block 30 suitable for use with the measurement system of FIG. 1 and consisting of a printed circuit board 32 and a thermal conductor 34. As oriented in FIG. 2, the thermal conductor is attached to the top surface of the circuit board 32. The circuit board 32 includes input terminal mounting holes 40 in which input terminals (not shown) may be mounted and temperature sensor mounting holes 42 in which a local temperature sensor (also not shown) may be mounted. The mounting holes 40 and 42 are connected to other circuits or connectors (not shown) by conductive traces 44. The traces 44, which are represented as dashed lines in FIG. 2, are either embedded in the circuit board 32 or located on the bottom surface of the circuit board 32 so that, in any event, the traces 44 are not in electrical contact with the thermal conductor 34.

The thermal conductor 34 is a block of thermally conductive material, such as copper or aluminum, that is most likely screwed or bolted to the circuit board 32. Alternatively, the thermal conductor 34 may be soldered to the circuit board 32 or attached with a suitable adhesive. In addition to being thermally conductive, the thermal conductor 34 is also electrically conductive and, therefore, must be isolated from the mounting holes 40 and 42. The thermal conductor 34 has openings 36 and 38 near the mounting holes 42 and 40, respectively, which provide the necessary clearance and creepage distances for electrically isolating the thermal conductor 34 from the holes 40 and 42 (as well as the related input terminals and temperature sensor). Minimum clearance and creepage distances are established by accepted industry safety standards such as those noted above, which take into account such factors as the voltage rating of the terminals and the insulating medium(s) between the terminals and the thermal conductor 34.

Figure 3:
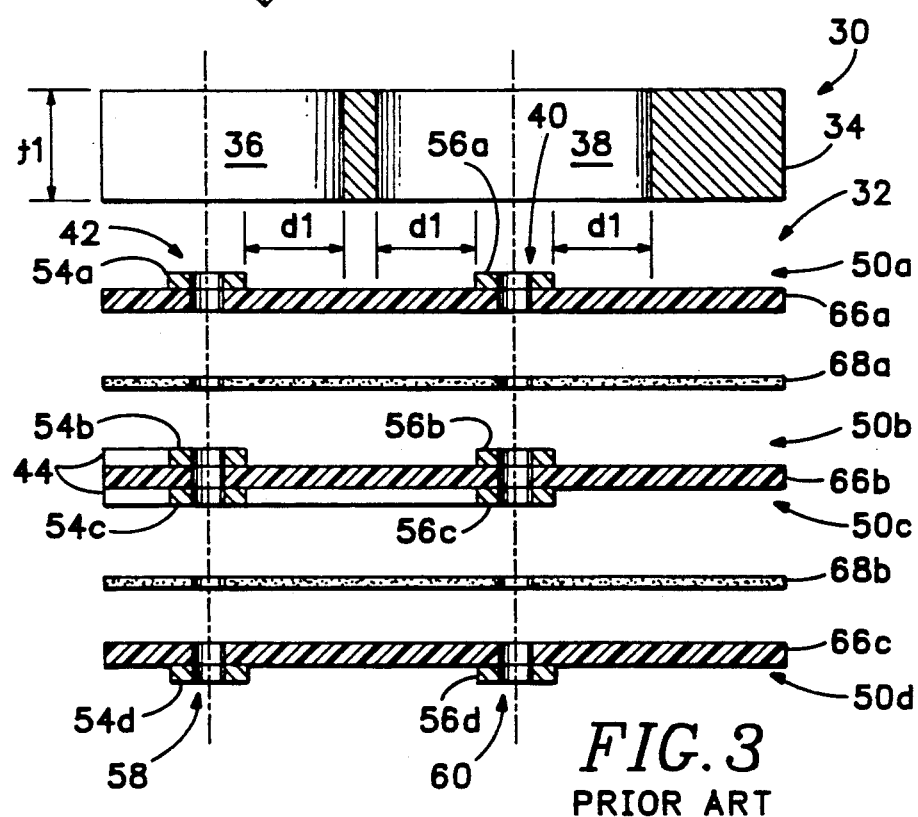
FIG. 3 is a sectional side view of the prior art isothermal block depicted in FIG. 2, wherein vertical dimensions are exaggerated and horizontal layers are separated for purposes of clarity.

FIG. 3 illustrates the prior art isothermal block 30 depicted in FIG. 2 taken in cross section along section line 3—3. The vertical scale of FIG. 3 is exaggerated and various layers of the isothermal block 30 are separated for purposes of clarity. The circuit board 32 may be a single or multi-layer board. For purposes of discussion, the circuit board 32 depicted in FIG. 3 is a four-layer board comprising conductive layers $50a$, $50b$, $50c$ and $50d$ formed on substrate layers $66a$, $66b$ and $66c$. The substrate layers are affixed to one another by an adhesive represented by layers $68a$ and $68b$, and stacked in a conventional manner to form the circuit board 32.

Each of the input terminal mounting holes 40 comprise four conductive pads $56a$, $56b$, $56c$ and $56d$ that are formed as part of conductive layers $50a$-$50d$, respectively. Similarly, each of the sensor mounting holes comprises four conductive pads $54a$, $54b$, $54c$ and $54d$, which also are formed as part of conductive layers $50a$-$50d$. A bore 60 passes through pads $56a$-$56d$, substrate layers $66a$-$66c$ and adhesive layers $68a$ and $68b$. Likewise, a bore 58 passes through pads $54a$-$54d$ and layers $66a$-$66c$, $68a$ and $68b$. The surface of bores 58 and 60 are coated so as to be electrically conductive. Thus, in a conventional manner, pads $54a$-$54d$ are electrically connected to bore 58 to form a sensor mounting hole 42 and pads $56a$-$56d$ are electrically connected to bore 60 to form an input terminal mounting hole 40.

In FIG. 3, the traces 44 are depicted as forming part of conductive layer $50c$, but may equally be formed as one or more of the conductive layers $50a$-$50d$. As noted above, the traces 44 connect the mounting holes 40 and 42 to other circuits and/or connectors.

The thermal conductor 34 is spaced a distance, denoted d1, from mounting holes 40 and 42. The spacing provided by distance, d1, isolates the thermal conductor 34 from voltages present at the input terminals and temperature sensor and, hence, at the respective mounting holes 40 and 42. As noted above, the minimum value of d1 is determined by industry safety standards. The standards specify spacings dependant on various factors, such as the voltages on the terminals and the insulating medium between the terminals and the thermal conductor. In the prior art isothermal block 30 of FIG. 3, the insulating medium is air and the surfaces of outer layers $50a$ and $50d$. The voltage rating of the terminals mounted in holes 40 depends on the particular application of the block 30. For example, an isothermal block 30 of the type depicted in FIGS. 2 and 3 that is rated for 250 volts must have a clearance and creepage distance of 0.080 inches between the thermal conductor 34 and the input terminal mounting holes 40 (i.e., $\alpha 1 = 0.080''$).

While distance, d1, provides adequate electrical isolation it also, unfortunately, reduces the thermal coupling between the input terminal mounting holes 40 and the temperature sensor mounting holes 42. As is well known by persons having ordinary skill in the temperature measurement field, thermal coupling is, at least partially, dependant on the proximity of the thermal conductor to the devices that are to be kept isothermal. Accordingly, the degree of thermal coupling between mounting holes 40 and 42 decreases as distance, d1, increases.

To a certain extent, thermal coupling can be improved by increasing the thickness of the thermal conductor 34. For example, to compensate for the spacing from the mounting holes 40 and 42, and provide adequate thermal coupling, the thermal conductor 34 in FIG. 3 may have a thickness, denoted t1, equal to approximately 0.25 inches (t1=0.25"). Accordingly, the thermal conductor 34 of the prior art may be substantially thicker than the overall thickness of the circuit board 32. In any event, prior art isothermal blocks of the type represented by the isothermal block 30 typically have relatively thick thermal conductors that increase the size and cost of prior art isothermal blocks.

Figure 4:
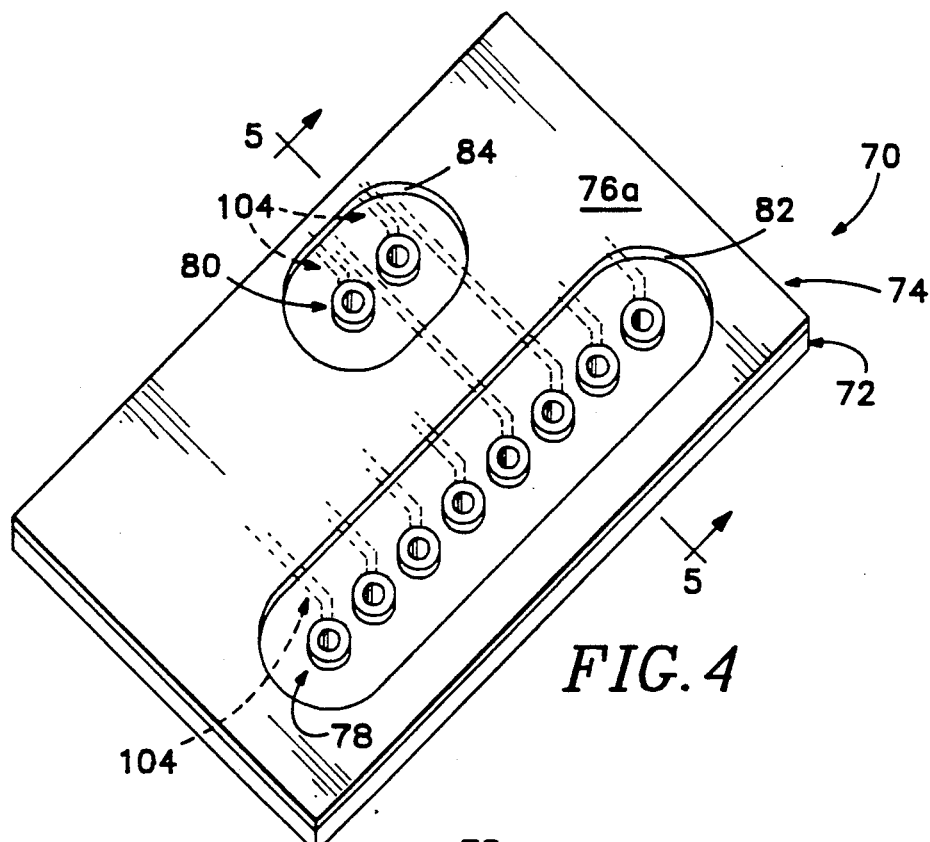
FIG. 4 is an isometric view of an isothermal termination block formed in accordance with the present invention and suitable for use in the measurement system of FIG. 1.

Turning next to FIG. 4, there is depicted an isometric view of an isothermal block 70 suitable for use in the temperature measurement system of FIG. 1 and formed in accordance with the present invention. The isothermal block 70 comprises a multi-layer printed circuit board 72 and a thermal conductor 74. In accordance with one actual embodiment, illustrated in FIG. 5 and discussed more fully below, the thermal conductor 74 comprises multiple layers that are interleaved with, and actually form a part of, the different layers of the circuit board 72. One thermally conductive layer $76a$ is illustrated in FIG. 4 and is located on the top surface of the printed board 72. The printed circuit board 72 includes terminal mounting holes 78 for mounting input terminals thereto and sensor mounting holes 80 for mounting a local temperature sensor thereto. The input terminals and temperature sensor are not shown in FIG. 4 for purposes of clarity. There are many types of suitable input terminals and temperature sensors that may be used and, as such, they do not form a part of the present invention. The mounting holes 78 and 80 are connected to circuits and/or connectors by electrically conductive traces 104. The traces 104 are depicted as dashed lines to show they are located on inner layers of the circuit board 72.

The multiple layers of the thermal conductor 74 are made of a thermally conductive material, preferably copper, although other materials, such as silver or aluminum, may be used as long as they exhibit good thermal conductivity. Since these materials are also electrically conductive, the various layers of the thermal conductor 74 must be isolated from the electrically conductive portions of the printed circuit board 72. As representatively illustrated in FIG. 5, thermally conductive layer $76a$ has openings 82 and 84, which provide electrical isolation from the mounting holes 78 and 80.

The thermally conductive layer $76a$ and the other various layers of the thermal conductor 74 are, preferably, formed using conventional printed circuit board processes, such as etching, for example. As a result, and as will become better understood from the following discussion, the thermal conductor 74 is substantially thinner than thermal conductors used in the prior art. Further, the thermal conductor 74 provides improved thermal coupling compared to that provided by the thermal conductors in the prior art due, in part, to the embedded thermally conductive layers (not shown in FIG. 4).

Figure 5:
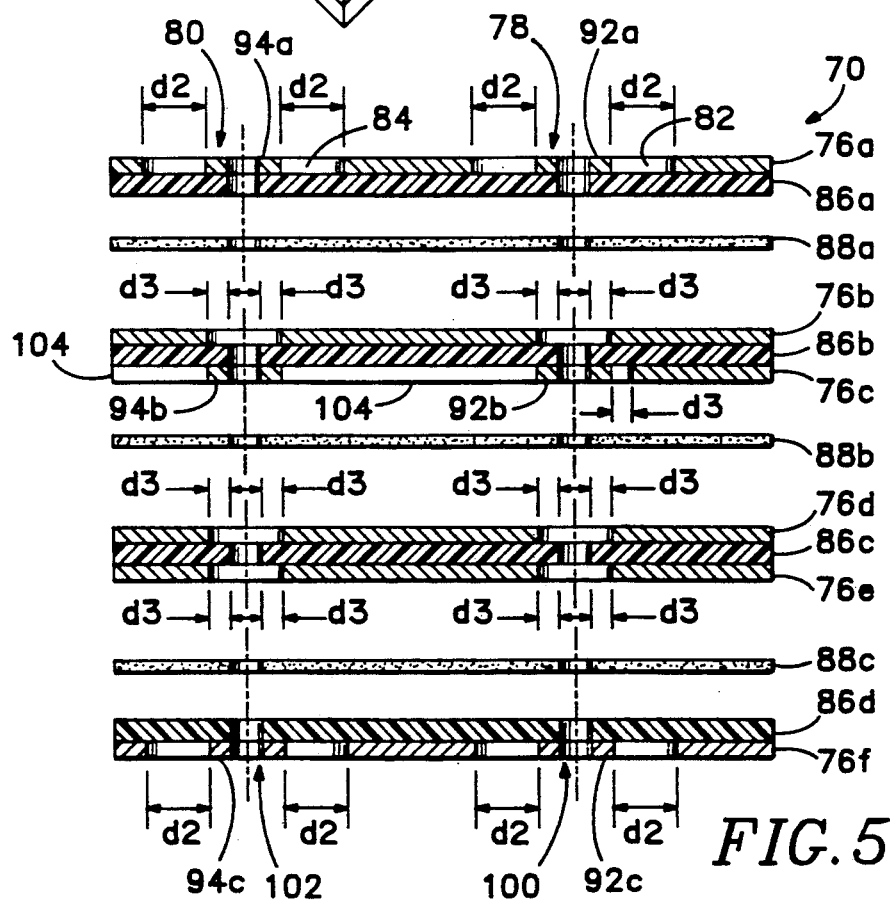
FIG. 5 is a simplified sectional side view of a preferred embodiment of the isothermal block depicted in FIG. 4, wherein vertical dimensions are exaggerated and horizontal layers are separated for purposes of better depicting various important features of the present invention.

FIG. 5 depicts a side-view of one preferred embodiment of the isothermal block 70 illustrated in FIG. 4, taken along section line 5—5. The vertical scale is exaggerated to enable a better understanding of important features of the isothermal block 70. In addition, various layers of the block 70 are separated in the vertical direction for purposes of clarity, but, it is to be understood that the these vertical separations do not exist in the physical embodiment.

As illustrated in FIG. 5, the circuit board 72 is a multi-layer board including four substrate layers 86a-86d and three adhesive layers 88a-88c interleaved and stacked from top to bottom. More specifically, the various layers are arranged from top to bottom in the following order: substrate layer 86a, adhesive layer 88a, substrate layer 86b, adhesive layer 88b, substrate layer 86c, adhesive layer 88c, and finally, substrate layer 86d.

Preferably, the input terminal mounting holes 78 and the temperature sensor mounting holes 80 are of a conventional construction and are formed by conventional printed circuit board processes, such as photo-imaging and etching techniques. An example of one possible construction of the mounting holes 78 and 80 is discussed next, and is provided to permit a better understanding of other features of the isothermal block 70. Each of the input terminal mounting holes 78 include electrically conductive pads 92a, 92b and 92c, where pad 92a is adjacent the upper surface of substrate layer 86a, pad 92b is adjacent the lower surface of substrate layer 86b and pad 92c is adjacent the lower surface of substrate layer 86d. A bore 100 passes through substrate layers 86a-86d, adhesive layers 88a-88c, and pads 92a, 92b and 92c. The bore 100 is coated with an electrically conductive material that forms a conductive layer (not shown) in the bore 100 such that pads 92a, 92b and 92c and bore 100 are electrically coupled to form input terminal mounting holes 78. Similarly, each of the sensor mounting holes 80 include electrically conductive pads 94a, 94b and 94c, where pad 94a is adjacent the upper surface of substrate layer 86a, pad 94b is adjacent the lower surface of substrate layer 86b and pad 94c is adjacent the lower surface of substrate layer 86d. A bore 102 passes through substrate layers 86a-86d, adhesive layers 88a-88c, and pads 94a, 94b and 94c. The bore 102 is coated with an electrically conductive material that forms a conductive layer (also not shown) in the bore 102 such that pads 94a, 94b and 94c and bore 102 are electrically coupled to form sensor mounting holes 80.

Electrically conductive traces 104 are located on the bottom surface of substrate layer 86b and connect the input terminal mounting holes 78 and the sensor mounting holes 80 to other circuits and connectors (not shown). It should be understood, however, that the particular location of traces 104 on the circuit board 72 is not limited to the location depicted in FIG. 5. Rather, depending upon the complexity of the circuit board 72 and the circuitry thereon, traces 104 may be formed on any of the electrically and thermally conductive layers 76a-76f.

As briefly discussed above, the thermal conductor 74 has multiple layers. In accordance with one preferred embodiment of the invention, the multi-layer thermal conductor 74 comprises six thermally conductive layers 76a-76f that are, preferably, formed on substrate layers 86a-86d using a conventional printed circuit process. The thermally conductive layers 76a-76f are interleaved with the substrate layers 86a-86d and adhesive layers 88a-88c as follows: conductive layers 76a, 76b and 76d are adjacent the top surfaces of substrate layers 86a, 86b and 86c, respectively, and conductive layers 76c, 76e and 76f are adjacent the bottom surfaces of substrate layers 86b, 86c and 86d, respectively.

As noted above, the thermally conductive layers 76a-76f may be formed on respective substrate layers via a conventional growth or etching process. Further, the thermally conductive layers 76a-76f and the pads 92a-92c and 94a-94c may be formed from the same conductive layer via the same process. That is, for example, a conductive layer formed on the surface of one of the substrates may be etched so as to form pads for the mounting holes 78 and 80 and the traces 104 as well as one of the thermally conductive layers 76a-76f.

As can be understood from the above discussion as well as by reference to FIG. 5, thermally conductive layers 76a and 76f are located on exterior surfaces of the printed circuit board 72, whereas conductive layers 76b-76e are embedded in the printed circuit board 72. The outer, thermally conductive layers 76a and 76f are spaced a distance, denoted d2, from mounting holes 78 and 80. More specifically, the layers 76a and 76f are spaced a distance, d2, from pads 92a, 92c, 94a and 94c. As noted above, the spacing provides electrical isolation between the conductive layers 76a and 76f and the mounting holes 78 and 80. In the presently preferred embodiment, air and the surface of substrate layers 86a and 86d are the insulators between the thermally conductive layers 76a and 76f and the mounting holes 78 and 80. Accordingly, the d2 distance between the thermally conductive layers 76a and 76f and the holes 78 and 80 of the isothermal block 70 formed in accordance with one preferred embodiment of the present invention may be substantially equal to the d1 distance between the isothermal block 34 and the mounting holes 40 and 42 of the prior art isothermal block 30 discussed above and illustrated in FIG. 2 and 3.

The embedded thermally conductive layers 76b, 76d and 76e on the other hand, are spaced a distance, denoted d3, from the mounting holes 78 and 80, or more specifically, from the bores 100 and 102. Similarly, thermally conductive layer 76c is spaced a distance, d3, from pads 92b and 94b and from traces 104. Since these layers are embedded in the circuit board 72, the substrate material of layers 86b and 86c, as well as the adhesive of layers 88a-88c act as the insulators between the thermally conductive layers 76b-76e and the mounting holes 78 and 80. Typically, conventional substrates and the adhesives (if used) provide better insulators than air and, additionally, are not subject to surface pollution and contamination because the are embedded in the circuit board 70. Accordingly, the distance, d3, between the mounting holes 78 and 80 and the embedded thermally conductive layers 76b-76e may be substantially less than the distance, d2, necessary for the external thermally conductive layers 76a and 76f, while still providing adequate electrical isolation for a given terminal or sensor voltage.

As discussed above, the degree of thermal coupling between the mounting holes 78 and 80 is determined, in part, by the proximity of the thermal conductor 74 to the holes. Accordingly, the proximity of the embedded layers 76b-76e to the mounting holes 78 and 80 provides better thermal coupling therebetween than was possible with the externally mounted thermal conductors used in prior art isothermal blocks.

The thermally conductive layers 76a–76f are usually substantially thinner than the substrate layers 86a–86d. Further, the total thickness of the multi-layer thermal conductor 74 may be substantially less than the thickness of the externally mounted thermal conductors used in the prior art, which is made possible because of the improved thermal coupling provided by the multi-layer thermal conductor 74. As an example, the six layer isothermal conductor 74 within the circuit board 72 in one preferred embodiment of the present invention is approximately 0.017" thick out of the circuit board's approximate 0.080" total thickness, whereas the thermal conductor 34 of a similarly rated (i.e. 250 volt) prior art isothermal block 30 may be as much as 0.250" thick. As a result, the isothermal block 70 of the present invention is substantially thinner and, correspondingly, lighter than a comparably rated prior art isothermal block.

While a preferred embodiment of the present invention has been illustrated and described by way of example, it is to be understood that various changes can be made therein without departing from the spirit and scope of the invention. For example, the thermal conductor may consist of a single layer embedded in the circuit board as long as it provides adequate thermal coupling. Further the thermally conductive layer(s) may be thin sheets interleaved with the multi-layer circuit board as opposed to being formed on the circuit board layers by a printed circuit board process such as etching. Consequently, the invention can be practiced otherwise than as specifically described herein.

The embodiments of the invention of which an exclusive property or privilege is claimed are defined as follows:

1. An isothermal block for maintaining wire connections at substantially the same temperature in a temperature measurement system, comprising:
   (a) a multi-layer printed circuit board having a first substrate layer stacked on a second substrate layer and connecting means on said first substrate layer for connecting said multi-layer printed circuit board to electric wires; and
   (b) a first thermally conductive layer formed on one of said first and second substrate layers for thermally coupling said connecting means, wherein said first thermally conductive layer is embedded in said multi-layer printed circuit board between said first and second substrate layers and is electrically isolated from said connecting means, said first thermally conductive layer being substantially thinner than said first or second substrate layers.

2. The isothermal block according to claim 1, wherein the isothermal block further comprises a second thermally conductive layer formed on an outer surface of said multi-layer printed circuit board that acts cooperatively with said first thermally layer to thermally couple said connecting means and is electrically isolated from said connecting means, said second thermally conductive layer being substantially thinner than said first or second substrate layers.

3. The isothermal block according to claim 2, wherein said first thermally conductive layer is spaced a first distance from said connecting means and said second thermally conductive layer is spaced a second distance from said connecting means, such that said first and second distances are sufficient to provide said electrical isolation from said connecting means.

4. The isothermal block according to claim 3, wherein said first distance is less than said second distance.

5. The isothermal block according to claim 3, wherein said first and second thermally conductive layers are made of copper.

6. An isothermal block for maintaining electrically conductive portions of a printed circuit board at substantially the same temperature in a temperature measurement system comprising:
   (a) a first printed circuit board layer having a first substrate layer and a first electrically conductive portion formed thereon;
   (b) a second printed circuit board layer stacked on said first printed circuit board layer, said second printed circuit board layer having a second substrate layer and a second electrically conductive portion formed thereon; and
   (c) a first thermally conductive layer formed on one of said first and second substrate layers for thermally coupling said first and second electrically conductive portions and electrically isolated from said first and second electrically conductive portions, wherein said first thermally conductive layer is interleaved between said first and second substrate layers and is substantially thinner than said first or second substrate layers.

7. The isothermal block according to claim 6, wherein the isothermal block further comprises a second thermally conductive layer formed on an outer surface of one of said first and second substrate layers and electrically isolated from said first and second electrically conductive portions, that is substantially thinner than said first or second substrate layers and acts cooperatively with said first thermally conductive layer to thermally couple said first and second electrically conductive portions.

8. The isothermal block according to claim 7, wherein said first and second thermally conductive layers are made of copper.

9. The isothermal block according to claim 7, wherein said first thermally conductive layer is spaced a first distance from said first and second electrically conductive portions and said second thermally conductive layer is spaced a second distance from said first and second electrically conductive portions, said first distance being substantially less than said second distance.

10. The isothermal block according to claim 9, wherein said first and second thermally conductive layers are made of copper.

* * * * *